United States Patent [19]
Watanabe et al.

[11] Patent Number: 5,675,331
[45] Date of Patent: Oct. 7, 1997

[54] DECODING DEVICE FOR DECODING A VARIETY OF CODE SIGNALS

[75] Inventors: Hiromi Watanabe, Mitaka; Hiroki Mizosoe, Kawasaki; Yukitoshi Tsuboi, Yokohama; Takayuki Miyo, Higashi-Murayama; Shuji Shinohara, Ashiya; Masuo Oku, Kamakura, all of Japan

[73] Assignee: Hitachi, Ltd., Tokyo, Japan

[21] Appl. No.: 572,100

[22] Filed: Dec. 14, 1995

[30] Foreign Application Priority Data

Dec. 14, 1994 [JP] Japan .................. 6-310193

[51] Int. Cl.$^6$ ............................ H03M 7/40
[52] U.S. Cl. ................ 341/67; 341/82; 348/403
[58] Field of Search ............... 341/67, 82, 95, 341/106; 348/403

[56] References Cited

U.S. PATENT DOCUMENTS

| | | | |
|---|---|---|---|
| 4,509,038 | 4/1985 | Hirano | 340/347 DD |
| 5,173,695 | 12/1992 | Sun et al. | 341/67 |
| 5,241,383 | 8/1993 | Chen et al. | 358/136 |
| 5,491,480 | 2/1996 | Jan et al. | 341/67 |
| 5,502,491 | 3/1996 | Sugiyana et al. | 348/403 |

*Primary Examiner*—Todd Deboer
*Attorney, Agent, or Firm*—Antonelli, Terry, Stout & Kraus, LLP.

[57] ABSTRACT

A decoding device is provided including a code FIFO memory unit for sequentially storing a bit stream, a barrel shifter for shifting and then outputting codes properly, an accumulator for computing the shift amount of the barrel shifter and issuing a request to read data to the code FIFO memory unit, a DCT coefficient decoder for decoding DCT coefficients, a variable-length code decoder for decoding variable-length codes other than DCT coefficients, a fixed-length code decoder for decoding fixed-length codes, a register unit for storing decoded data, a decoding controller for controlling the decoders in accordance with the decoded data stored in the register unit and decoded data output by the decoders and a memory controller for controlling operations to store DCT coefficients in a memory unit A. The DCT coefficient decoder, the variable-length code decoder and the fixed-length code decoder are connected in parallel to the output of the barrel shifter and the memory controller is controlled by the decoding controller. By virtue of this structure, the decoding device is capable decoding a bit stream comprising variable-length codes mixed with fixed-length codes. The decoding device is also capable of changing processing of a next code in accordance with decoded codes. Further, these operations can be implemented by means of a simple and reasonable configuration. On top of that, the process of decoding codes at a required high speed is carried out by an independent circuit, allowing the processing power of the decoding circuit to be enhanced.

11 Claims, 11 Drawing Sheets

FIG. 10

CODE TABLE

| CODE | PREFIX | INPUT | OUTPUT (RUN) | OUTPUT (LEVEL) |
|---|---|---|---|---|
| ......... | ......... | ......... | ......... | ......... |
| 0001 10S | 0001 | 10S | 1 | 2 |
| 0001 11S | 0001 | 11S | 5 | 1 |
| 0001 01S | 0001 | 01S | 6 | 1 |
| 0001 00S | 0001 | 00S | 7 | 1 |
| 0000 110S | 0000 1 | 10S | 0 | 4 |
| 0000 100S | 0000 1 | 00S | 2 | 2 |
| 0000 111S | 0000 1 | 11S | 4 | 1 |
| 0000 101S | 0000 1 | 01S | 8 | 1 |
| ......... | ......... | ......... | ......... | ......... |

EXAMPLE OF VARIABLE-LENGTH CODE IN MPEG DCT COEFFICIENT

DECODING DEVICE FOR DECODING A VARIETY OF CODE SIGNALS

BACKGROUND OF THE INVENTION

The present invention relates to a decoding device. More specifically, the present invention relates to a decoding device for decoding a variety of code signals such as variable-length codes and fixed-length codes for conveying video information and the like.

As a means for compressing a digital signal conveying video information and the like, variable-length codes are known. The variable-length codes comprise codes having code lengths different from each other depending upon the frequency of generation of the information.

A decoding circuit shown in FIG. 9 is known as an effective decoding device for decoding variable-length codes. Such a decoding device is disclosed in U.S. Pat. No. 5,173,695. The variable-length codes to be decoded are input from a port B1 to a buffer B2 in N-bit units in accordance with a read signal (or a code request signal) from a latch B8. A typical value of N is 24. The input bit stream is held in a latch B4. A signal output by the latch B4 is also supplied to a latch B3.

2N bits output by the latches B3 and B4 are input to a barrel shifter B5. The barrel shifter B5 outputs N bits which are appropriately extracted from the input 2N bits in accordance with a shift signal from a latch B7. The appropriately-extracted and output N-bit codes are supplied to a codeword table B6. The codeword table B6 outputs decoded data to a port BA and, at the same time, outputs the code length of the variable-length code representing the decoded data. The code length is supplied to an adder B9 to be added to the output of the latch B7 which holds an immediately preceding shift quantity. The result of the addition is output to the latch B7. At that time, if the shift quantity exceeds N bits, a carry signal is output by an adder B9 and held in a latch B8. The carry signal from the latch B8 is supplied to the buffer B2 as well as the latches B3 and B4 in which new codes comprising N bits are input.

In recent years, the coding art is becoming complex, making it necessary to decode streams in which variable-length codes and fixed-length codes coexist in a complex manner. Such a requirement can not be met by only using a decoding circuit for the variable-length codes described above. Instead, a decoding device also capable of effectively decoding a variable-length code coexisting with a fixed-length code is required. In addition, by merely providing a decoding device for simply decoding variable-length codes separately from a decoding device for simply decoding fixed-length codes, the circuit configuration will become complex, giving rise to, among other things, an increase in circuit area. On top of that, there is a fear of high-speed signal processing being hindered.

In addition, the increased complexity of the coding process results in the bit stream having a more complicated structure. That is to say, in a bit stream resulting from the same coding art, a bit stream part requiring a high-speed decoding process coexists in a complicated manner with a bit stream part which tolerates a relatively longer time required in the decoding process. As a result, it is necessary to implement the configuration of an excellent decoding device for decoding a bit stream with such a complex structure.

On top of that, when a bit stream having a complex structure is decoded, the properties of the next codes and their decoding art vary depending upon the codes already decoded and the codes being decoded at the present point of time. As a result, an appropriate decoding process can not be executed unless the decoding process is adjusted to the change in property of the next code.

SUMMARY OF THE INVENTION

It is a main object of the present invention to provide a signal decoding device that can decode a bit stream including a plurality of types of codes using a reasonable circuit configuration.

It is another object of the present invention to provide a signal decoding device capable of decoding a bit stream in which variable-length codes coexist with fixed-length codes.

It is still another object of the present invention to provide a signal decoding device with a simple and reasonable construction which signal decoding device can decode a bit stream in which variable-length codes coexist with fixed-length codes.

It is a still further object of the present invention to provide a signal decoding device that can decode in at high speed a bit stream in which a bit stream part requiring a high-speed decoding process coexists with a remaining bit stream part tolerating a relatively longer time required in the decoding process.

It is a still further object of the present invention to provide a signal decoding device that can carry out an appropriate decoding process even in a case in which the property of the next codes and their decoding art have to be changed depending upon data already decoded due to the structure of a bit stream.

In order to achieve the objects described above, the present invention provides a decoding device comprising: a common shift circuit for inputting a bit stream comprising codes of different types; a plurality of decoding circuits for the different types of codes described above connected in parallel to the output of the shift circuit for use in decoding code data shifted by the shift circuit described above; a code length bus for supplying pieces of code length data output by the decoding circuits to an accumulator for controlling the shift circuit; and a decoded data bus connected to the outputs of the decoding circuits.

According to a preferred embodiment provided by the present invention, the decoding circuits described above comprise a variable-length code decoding circuit for decoding variable-length codes and a fixed-length code decoding circuit for decoding fixed-length codes, wherein decoded data output by the variable-length code decoding circuits and fixed-length decoding circuits is supplied to the common decoded data bus.

According to another preferred embodiment provided by the present invention, the decoding circuits described above comprise a first variable-length code decoding circuit for decoding codes requiring a high-speed decoding process such as codes of DCT coefficients and a second variable-length code decoding circuit for decoding codes requiring a decoding process at a speed lower than the processing speed required by the first decoding circuit, wherein pieces of decoded data output by the first and second variable-length code decoding circuits are supplied respectively to a DCT coefficient data bus and a decoded data bus separate from the DCT coefficient data bus.

In addition, according to still another preferred embodiment provided by the present invention, the decoding device comprises a register unit for storing data decoded by the decoding circuits (typically the variable-length and fixed-length code decoding circuits) through the common decoded data bus in a predetermined order and a decoding control circuit for determining a next decoder to carry out a next decoding operation in accordance with the value of decoded data stored in the register unit and decoded data appearing on the decoded data bus.

According to the present invention, since the decoding circuits for different types of codes are provided in parallel to each other, the shift circuit, the decoded data bus and the code length bus can be shared by the decoding circuits, allowing a reasonable decoding device with a small circuit area to be provided.

By providing a first decoder for decoding codes requiring a high-speed decoding process in parallel to and separately from a second decoder for decoding codes requiring a decoding process at a speed lower than the processing speed required by the first decoder, the processing power of the decoding device can be enhanced, allowing a high-speed decoding process to be achieved.

In addition, since the decoded output of the first decoder for decoding codes requiring a high-speed decoding process is output through a bus provided independently of a bus for outputting the decoded output of the other decoder, the time limitation on transmitting the decoded data through the buses is relieved.

On top of that, since data decoded by the decoding circuits (typically the variable-length and fixed-length code decoding circuits) is stored in the register unit through the common decoded data bus in a predetermined order, a signal decoding device that allows the processing of the next codes to be changed in accordance with the decoded codes can be implemented by a simple and reasonable circuit configuration.

The objects and characteristics of the present invention will become more apparent from the following detailed description of preferred embodiments with reference to the accompanying diagrams.

BRIEF DESCRIPTION OF THE DRAWINGS

FIG. 10 is a diagram showing the configuration of a variable-length decoded word;

DESCRIPTION OF THE PREFERRED EMBODIMENTS

Figure 1:
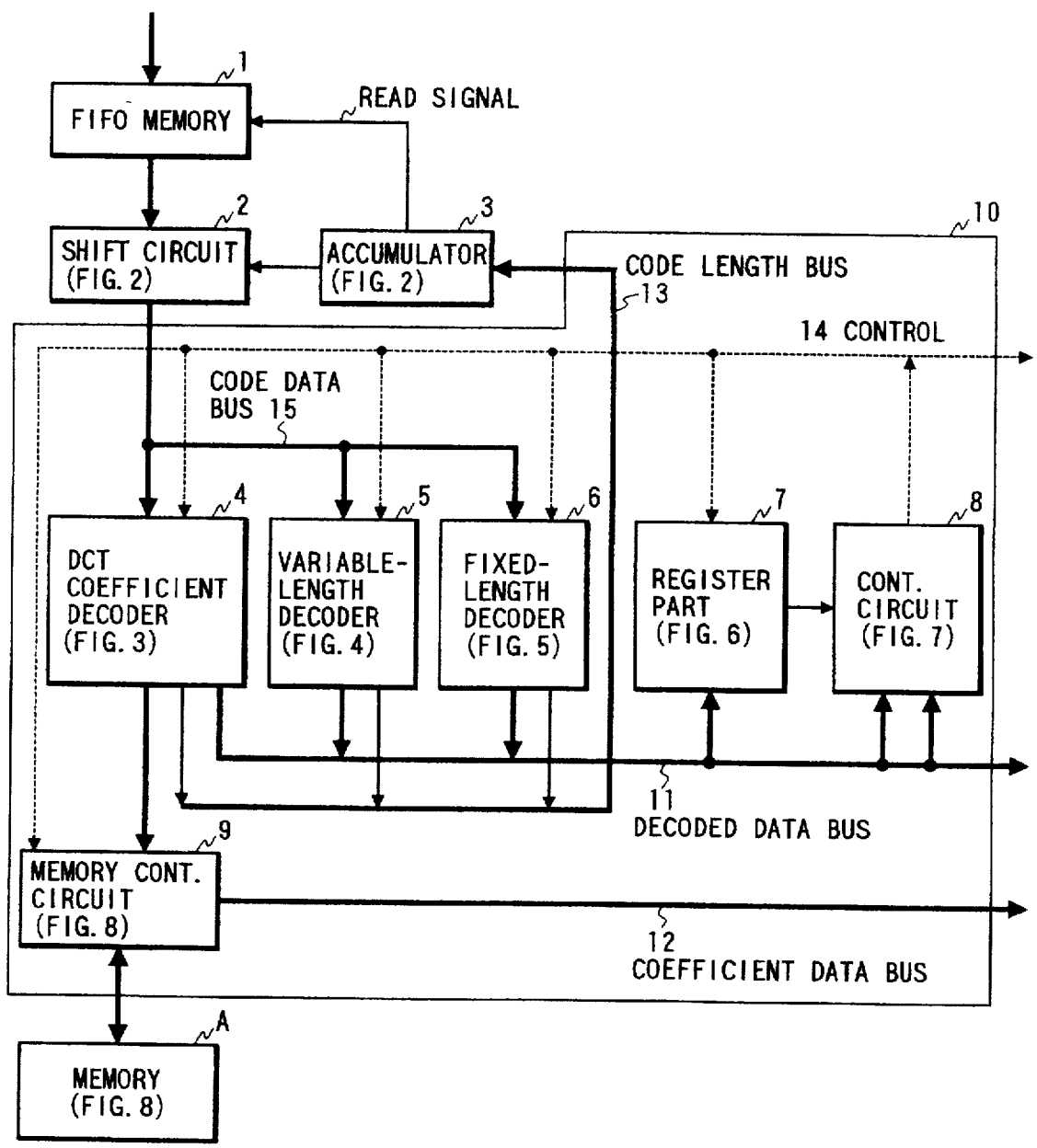
FIG. 1 is a block diagram showing the configuration of an embodiment implementing a decoding device in accordance with the present invention.

FIG. 1 is a block diagram showing the configuration of an embodiment implementing a decoding device in accordance with the present invention. The embodiment implements a decoding device for decoding a bit stream resulting from a process of compressing and encoding a video signal which process adopts an MPEG (Moving Picture Coding Experts Group) technique or the like. Solid and dotted lines shown in the figure denote data and control signals, respectively. The detailed configuration of each block will be explained later in detail by referring to a drawing for the block.

A bit stream of an encoded digital signal is supplied to an FIFO (First In First Out) memory unit 1 shown in FIG. 1. The bit stream is stored in the FIFO memory unit 1 in the order the bit stream is supplied thereto. A code request signal (read signal) generated by the accumulator 3 is used to output pieces of the stored information from the FIFO memory unit 1 in the order they were stored therein. The shift circuit 2 shifts and then outputs predetermined bits of code data input from the FIFO memory unit 1 by a predetermined bit-count. The accumulator 3 computes the shift amount of the shift circuit 2 by using code length data supplied thereto through a code length bus 13, to be described later, as a base and supplies the shift amount to the shift circuit 2. At the same time, the accumulator 3 requests the FIFO memory unit 1 to output the next code data to be processed by the shift circuit 2 by means of the read signal.

Data output by the shift circuit 2 is supplied to a DCT coefficient decoder 4, a variable-length code decoder 5 and a fixed-length code decoder 6 simultaneously through a code data bus 15.

The DCT coefficient decoder 4 decodes DCT coefficients which have been encoded into variable-length codes. The DCT coefficients resulting from the decoding operation are output to a coefficient data bus 12 through a memory control circuit 9 and a memory unit A. In addition, the code length data indicating the bit-count of a decoded code is output to the code length bus 13. As described above, the code length data is used for determining the shift amount of the shift circuit 2. Furthermore, a result of decoding an EOB (End of Block) code by an EOB decoder to be described later is output to a decoded data bus 11.

The variable-length code decoder 5 decodes code data of variable-length codes resulting from an encoding process by a variable-length coder, outputting the decoded data to the decoded data bus 11 and, at the same time, outputting the code length data indicating the bit-count of a decoded code to the code length bus 13. Here, the variable-length code decoder 5 decodes code data of variable-length codes other than DCT coefficients which variable-length codes result from a variable-length encoding process.

The fixed-length code decoder 6 decodes code data of fixed-length codes among the data output by the shift circuit 2. These fixed-length codes result from an encoding process by a fixed-length coder. The fixed-length code decoder 6 outputs the decoded data to the decoded data bus 11, and, at the same time, outputs the code length data indicating the bit-count of a decoded code to the code length bus 13.

The memory control circuit 9 carries out control to temporarily store DCT coefficients decoded by the DCT coefficient decoder 4 in the memory unit A. A register unit 7 comprises a plurality of registers for sequentially storing pieces of decoded data from the decoded data bus 11. A control circuit 8 receives the decoded data resulting from the decoding processes carried out in the variable-length code decoder 5 and the fixed-length code decoder 6 and the decoded data stored in the register unit 7. These pieces of decoded data are used by the control circuit 8 in conjunction with the contents of a program counter indicating the present state of the control circuit 8 for determining decoders will to carry out the next decoding operation. The control circuit 8 controls the operations of the decoders 4, 5 and 6 as well as the memory control circuit 9 by transmitting control signals through a control bus 14.

Figure 11:
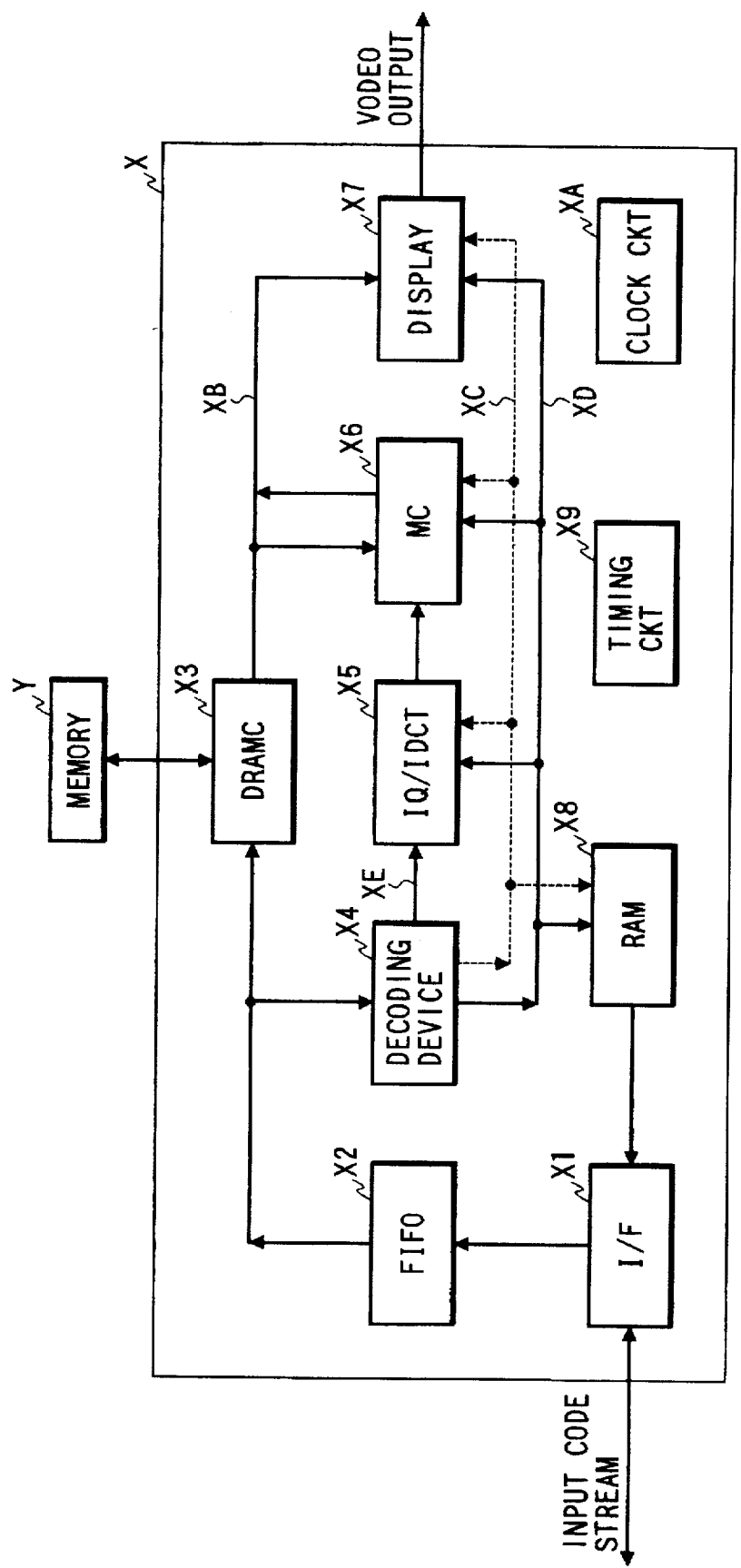
FIG. 11 is a diagram showing the configuration of an MPEG decoder using the present invention.

As described above, the embodiment of FIG. 1 implementing a decoding device has the code data bus 15, the decoded data bus 11, the coefficient data bus 12 and the code length data bus 13. A bus is a collection of signal lines, serving as a path of main signals. The decoded data bus 11 is a common bus connected to the outputs of the variable-length code decoder 5 and the fixed-length code decoder 6 as well as the register unit 7 and the control circuit 8. The decoded data bus 11 is also used for outputting the decoded data to components external to the decoding device 10 such as a motion compensating circuit x6 of FIG. 11 provided at the next stage. The coefficient data bus 12 is used for outputting data output by the DCT coefficient decoder 4 to components external to the decoding device 10 such as a decoder x5 of FIG. 11 provided at the next stage for carrying out inverse-quantization and inverse-DCT processes. The decoded data bus 11 is provided separately from the coefficient data bus 12. The code length bus 13 is a common bus connected to the decoders 4, 5 and 6 as well as to the accumulator 3, allowing code length data output by the decoders 4, 5 and 6 to be supplied to the accumulator 3.

Each block shown in FIG. 1 is explained in detail as follows.

Figure 2:
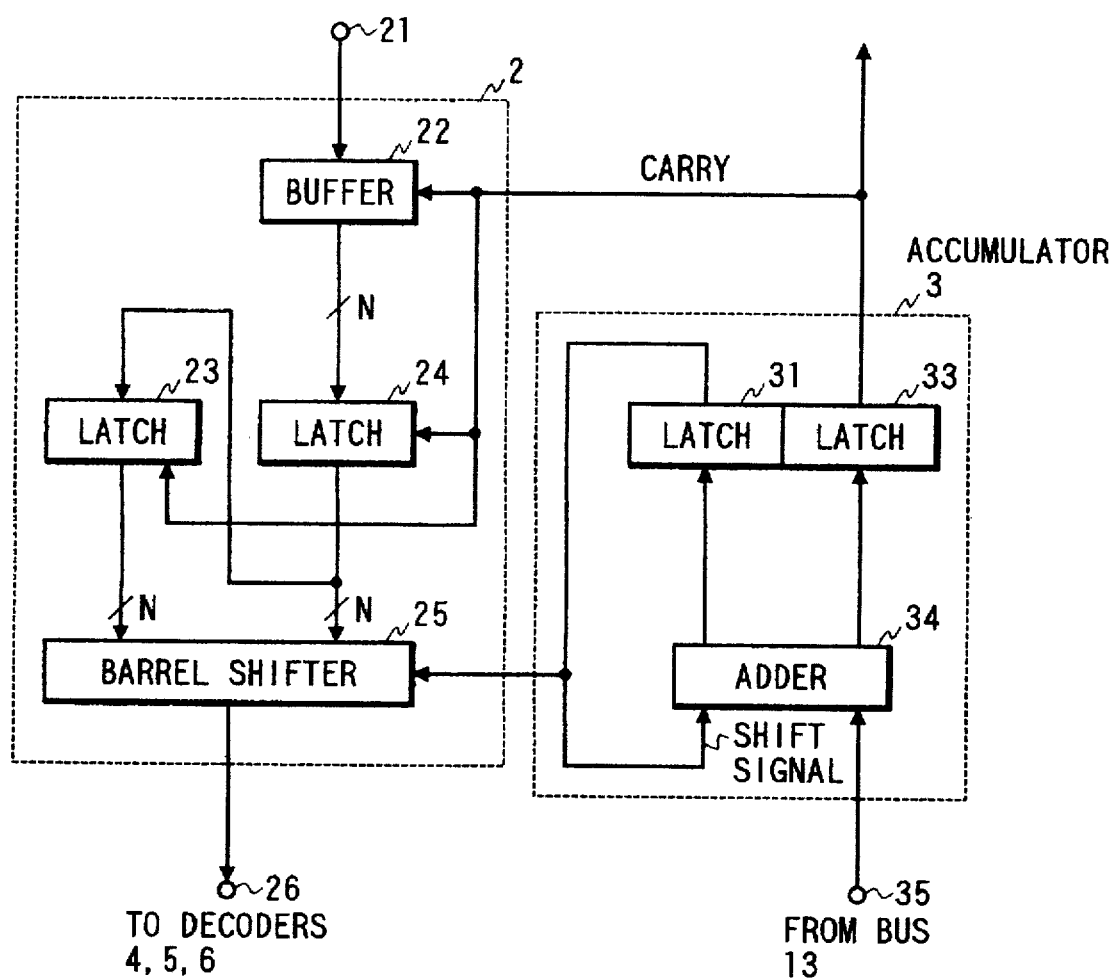
FIG. 2 is a diagram showing in detail the configurations of a shift circuit 2 and an accumulator 3 shown in FIG. 1.

FIG. 2 is a diagram showing the configurations of the shift circuit 2 and the accumulator 3 shown in FIG. 1. As shown in FIG. 2, codes to be decoded are supplied from the FIFO memory unit 1 shown in FIG. 1 to a buffer 22 through a port 21. The FIFO memory unit 1 can be connected to the buffer 22 directly or indirectly through a buffering means or the like. Codes temporarily stored in the FIFO memory unit 1 are input to the buffer 22 from the FIFO memory unit 1 as requested by a read signal (or a code request signal) output by the accumulator 3 in N-bit units where N is a predetermined number set in advance. A typical value for N is 24. The codes are temporarily held in the buffer 22. The code data input to the buffer 22 is held in a latch 24. The output of the latch 24 is supplied to a barrel shifter 25 as well as to a latch 23. The barrel shifter 25 receives 2N-bit code data comprising outputs of the latches 23 and 24. The barrel shifter 25 is controlled so that the 2N-bit code data is shifted by a predetermined bit-count, and predetermined bits, typically N bits, are output in accordance with a shift signal provided by the accumulator 3. The number of bits to be output by the barrel shifter 25 is determined in advance. The code data of the predetermined bits in length output by the barrel shifter 25 is supplied to the decoders 4, 5 and 6 shown in FIG. 1 via a port 26 directly or indirectly through a buffering means or the like.

The accumulator 3 carries out predetermined processings, controlling, among other things, the shift bit-count of the barrel shifter 25, the latch operations of the latches 23 and 24 and the operation to read out data from the FIFO memory unit 1. The code length data indicating the code length of the code data output by the decoders 4, 5 and 6 shown in FIG. 1 is supplied to an adder 34 via the code length bus 13 and a port 35 directly or indirectly through a buffering means or the like. The adder 34 adds the code length input from the port 35 to the output of a latch 31 for holding an immediately preceding code length, supplying the result of the addition to the barrel shifter 25 as a shift signal. In addition, in this case, when the shift amount indicated by the result of the addition exceeds the predetermined number of bits, that is N bits, it is necessary to supply new code data to the barrel shifter 25. A carry signal is therefore output by the adder 34. The carry signal is held in the latch 33 and also supplied to the FIFO memory unit 1, the buffer 22 as well as the latches 23 and 24. New N-bit code data is read from the FIFO memory unit 1 in accordance with the carry signal and held in the latch 24 through the buffer 22. In addition, the carry signal transfers code data from the latch 24 to the latch 23, supplying a new 2N-bit code to the barrel shifter 25.

Figure 3:
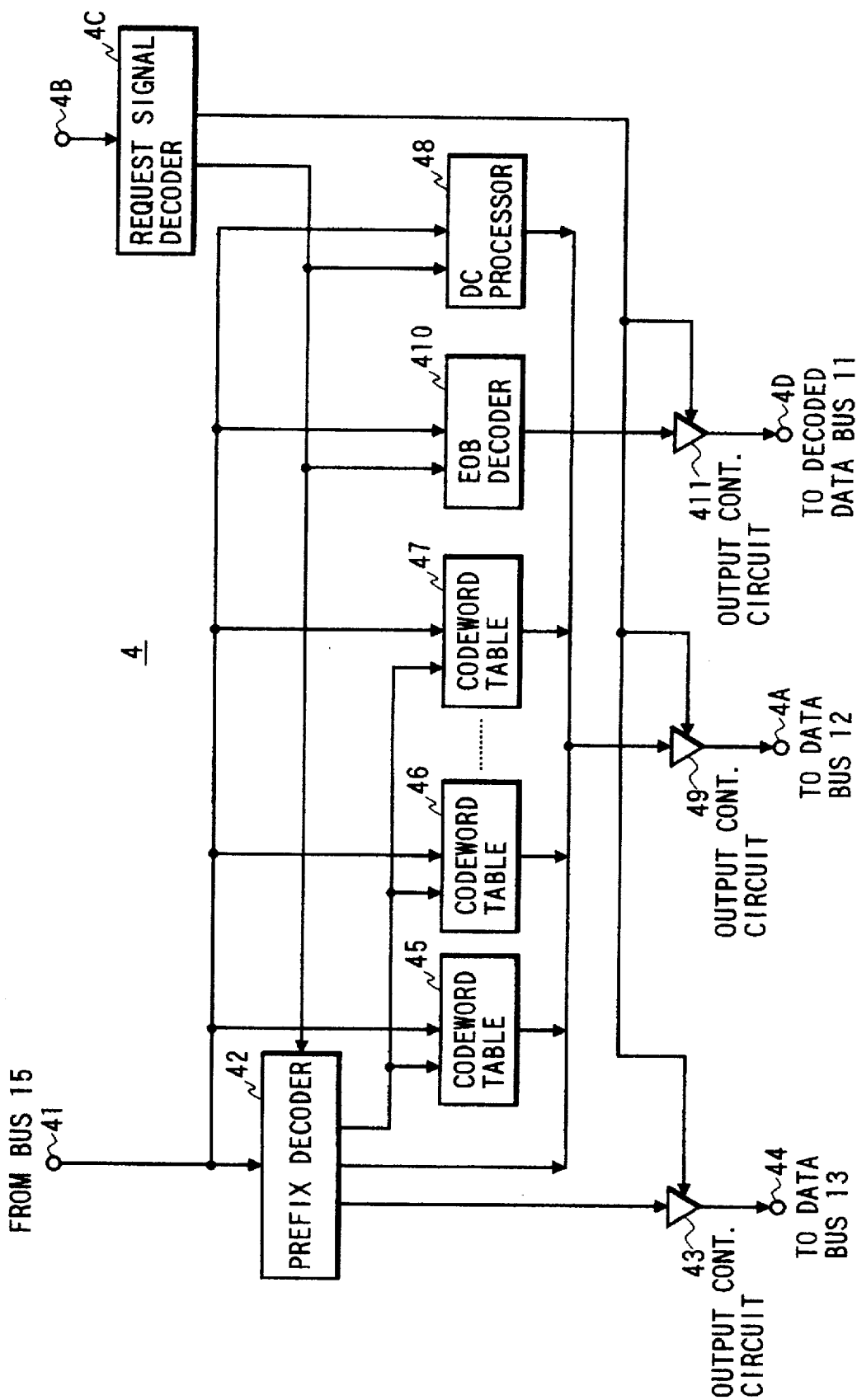
FIG. 3 is a diagram showing the configuration of a DCT coefficient variable-length code 4 of FIG. 1.

FIG. 3 is a diagram showing the configuration of the DCT coefficient decoder 4 shown in FIG. 1.

In the present embodiment, a decoder using codeword tables is employed. In particular, a decoder applying a technique of selecting a variable-length codeword table by means of a prefix appended to a variable-length code is employed. A prefix is a portion at the head of code data comprising several bits. It should be noted that, as an alternative configuration of the decoder, it is also possible to employ another circuit which can decode variable-length codes without using a codeword table. Nonetheless, by carrying out a decoding process using a codeword table, the decoding can be done at a high speed. On top of that, by using prefixes, the size of the codeword table can be reduced.

Code data comprising the predetermined N bits supplied by the barrel shifter 25 shown in FIG. 2 is transmitted via the code data bus 15 shown in FIG. 1 and a port 41 directly or indirectly to a prefix decoder 42 and codeword tables 45, 46 and 47 for variable-length codes. The prefix decoder 42 decodes the prefix of a variable-length code transmitted by the barrel shifter 25, generating a selection signal for selecting one of the codeword tables 45, 46 and 47. A prefix is a portion at the head of a code comprising several bits, as shown in FIG. 10. As described above, one of the codeword tables 45, 46 and 47 is selected by the selection signal. The selected codeword table 45, 46 or 47 creates decoded data comprising some appropriate bits from the code data bus 15, outputting the decoded data to the coefficient data bus 12. As described above, the prefix decoder 42 decodes the prefix to determine the code length of a variable-length code to be output to the code length data bus 13 through a port 44 even though the code length can be determined in another way.

It should be noted that, as an alternative, code length data can also be stored in the codeword tables 45, 46 and 47 and is output from one of the codeword tables 45, 46 and 47 selected in accordance with the output of the prefix decoder 42. In this case, the configuration area of the prefix decoder 42 decreases but the configuration areas of the codeword tables 45, 46 and 57 increase, allowing areas to be laid out optimally on the chip.

In addition, in the case of the configuration in which code length data is output from the prefix decoder 42, code length data can be obtained in a short time in comparison with the configuration to output code length data from the codeword tables 45, 46 and 47. Next, the code length data undergoes processing such as addition in the accumulator 3. Since the next bit-stream decoding is started by a result of the processing carried out in the accumulator 3, the configuration allowing code length data to be obtained in a short time is an effective means for increasing the speed of the decoding device as a whole.

The decoder shown in FIG. 3 has a DC processor 48 and an EOB decoder 410 in addition to the codeword tables 45, 46 and 47. The DC processor 48 and the EOB decoder 410 are used especially for decoding special codes among DCT coefficients. For example, these elements can be used to decode, special which can not be decoded by the codeword tables 45, 46 and 47. The DC processor 48 decodes a code showing a direct-current component of each macroblock, a code at the head of DCT coefficients. The EOB decoder 410 is, on the other hand, a circuit for decoding an EOB code indicating that the subsequent DCT coefficients are zeros. The outputs of the code tables 45, 46 and 47 and that of the DC processor 48 are output to the coefficient data bus 12 shown in FIG. 1 through a port 4A. The output of the EOB decoder 410 is output to the decoded data bus 11 through a port 4D to be supplied to the control circuit 8 and other components. It should be noted that, in this embodiment, the output of the EOB decoder 410 is output to the decoded data bus 11 as described above. Since the DCT coefficient decoder 4, the variable-length code decoder 5 and other decoders each sequentially decode a bit stream supplied thereto serially, the decoded data bus 11 used by the EOB decoder 410 can be shared by the variable-length code decoder 5 and the other decoders for outputting data without giving rise to data contention on the decoded data bus 11. By sharing a bus in this way, the area occupied by buses can be reduced.

A request decoder 4C receives a control signal from the control circuit 8 shown in FIG. 1 through a control bus 14, determining whether or not the execution of a process to decode DCT coefficients has been requested. The request decoder 4C decodes a request received from the control circuit 8 through a port 4B, controlling the prefix decoder 42, the DC processor 48, the EOB decoder 410 as well as output control circuits 43, 49 and 411. As one of various alternatives for using the present invention, when a process to decode DCT coefficients is requested with the prefix decoder 42 put in a normal operation state, the output control circuits 43 and 49 are controlled into an activated state and decoded data is output to the coefficient data bus 12. In the case of the present embodiment, the operation to output decoded data is controlled by controlling the output control circuits 43 and 49. It should be noted, however, that as an alternative, only when a process to decode DCT coefficients is requested, control is carried out by using the output of the request decoder 4C in such a way that the prefix decoder 42 or the codeword tables 45 to 47 are put in an activated state. With this alternative, the same decoding process can be implemented as well.

In the case of the present embodiment, even if a process to decode DCT coefficients is requested, a DC component or an EOB code is decoded by exercising control to put the prefix decoder 42 in an non-activated state and the DC processor 48 or the EOB decoder 410 as well as the output control circuit 49 or 411 in an activated state, allowing a decoded result to be output to the coefficient data bus 12 or the decoded data bus 11. Such a configuration is adopted because, in a process of decoding an EOB code, it is sufficient to merely output a decoded result for each EOB code. It is also possible, however, to embrace a configuration in which a decoded result is output directly by decoding several bits at the head of an EOB code by means of the prefix decoder 42. In addition, operations are required in the processing of a DC component, making it necessary to provide a processor independent of the codeword tables 45 to 47.

Figure 4:
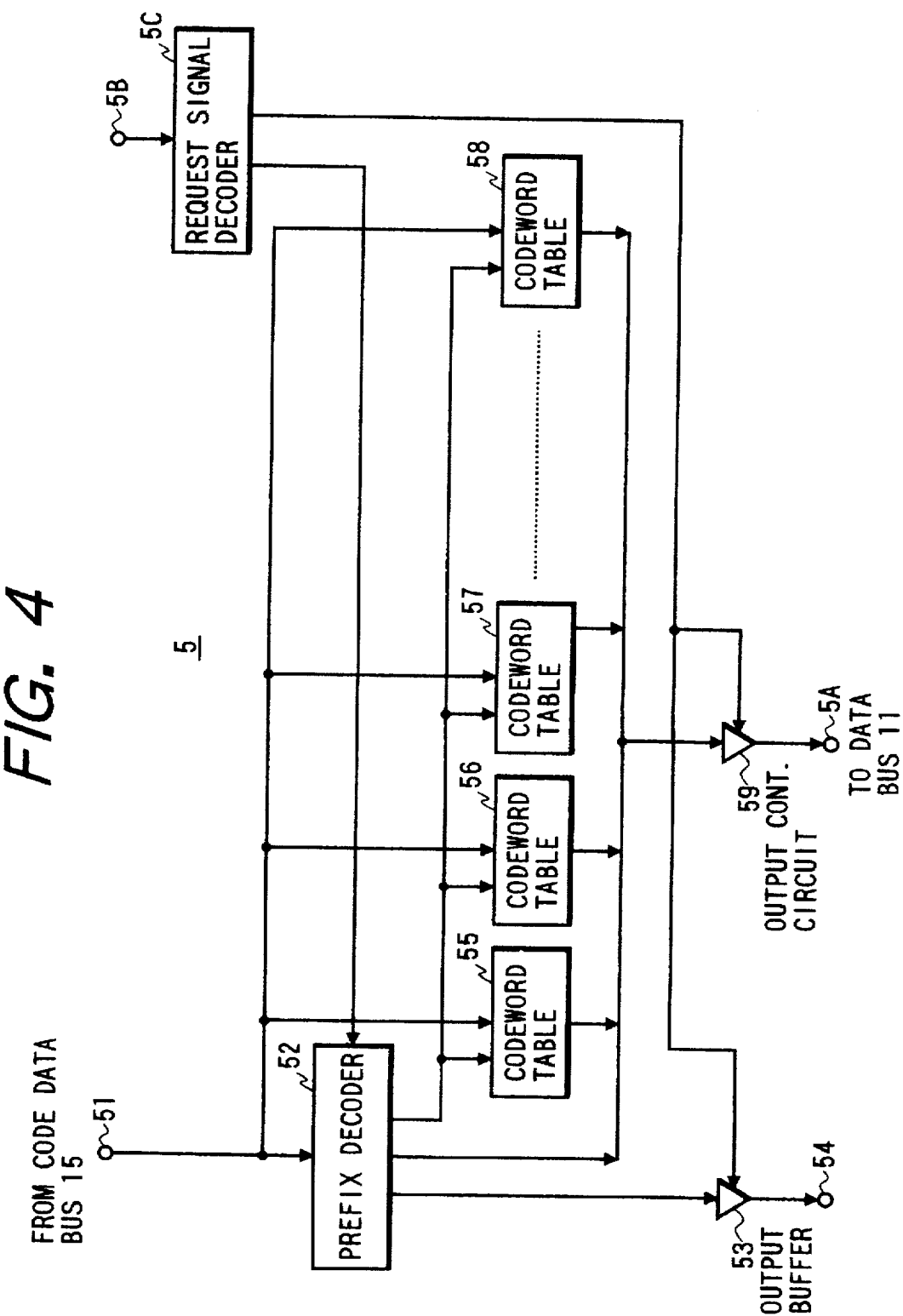
FIG. 4 is a diagram showing the configuration of a variable-length code 5 of FIG. 1 for decoding data other than DCT coefficients.

FIG. 4 is a diagram showing the configuration of the variable-length code decoder 5 of FIG. 1 for decoding data other than DCT coefficients.

As shown in the figure, the variable-length code decoder 5 comprises a prefix decoder 52 for decoding the prefix of a variable-length code in order to generate a signal for selecting one of variable-length codeword tables 55, 56, 57 and 58, or the variable-length codeword tables 55, 56, 57 and 58 and a request decoder 5C for determining whether or not the execution of a process to decode a variable-length code has been requested. It should be noted that a prefix is several bits at the head of a code. An appropriate bit stream transmitted by the barrel shift 25 is supplied to an input port 51 which is connected to the code data bus 15. As described above, the prefix decoder 52 decodes several bits at the head of a code in order to generate a signal for selecting one of the variable-length codeword tables 55, 56, 57 and 58. At the same time, the prefix decoder 52 outputs a code length to an output buffer 53. The selection signal generated by the prefix decoder 52 selects one of the variable-length codeword tables 55, 56, 57 and 58. The selected codeword table 55, 56, 57 or 58 creates decoded data comprising some appropriate bits from the code data bus 15, outputting the decoded data to the coefficient data bus 11. The request decoder 5C inputs a signal from the control bus 14. Receiving data conveyed by the signal, the request decoder 5C decodes a request for a process to decode a variable-length code other than a DCT coefficient and controls outputs to the decoded data bus 11 and the code length data bus 13.

Since the circuit configuration and the operation of the variable-length code decoder 5 are the same as those of the DCT coefficient decoder 4, no detailed explanation is given. The difference from the DCT coefficient decoder 4 is that the outputs of the codeword tables 55, 56 and 57 are connected to the decoded data bus 11 through an output control circuit 59 for the reasons described earlier. In addition, there is another difference in the decoding of data other than DCT coefficients. To be more specific, since special processings such as the decoding of a DC component and the decoding of an EOB code are not required, all data is decoded by the prefix decoder 52 and the codeword tables 55, 56 and 57.

Figure 5:
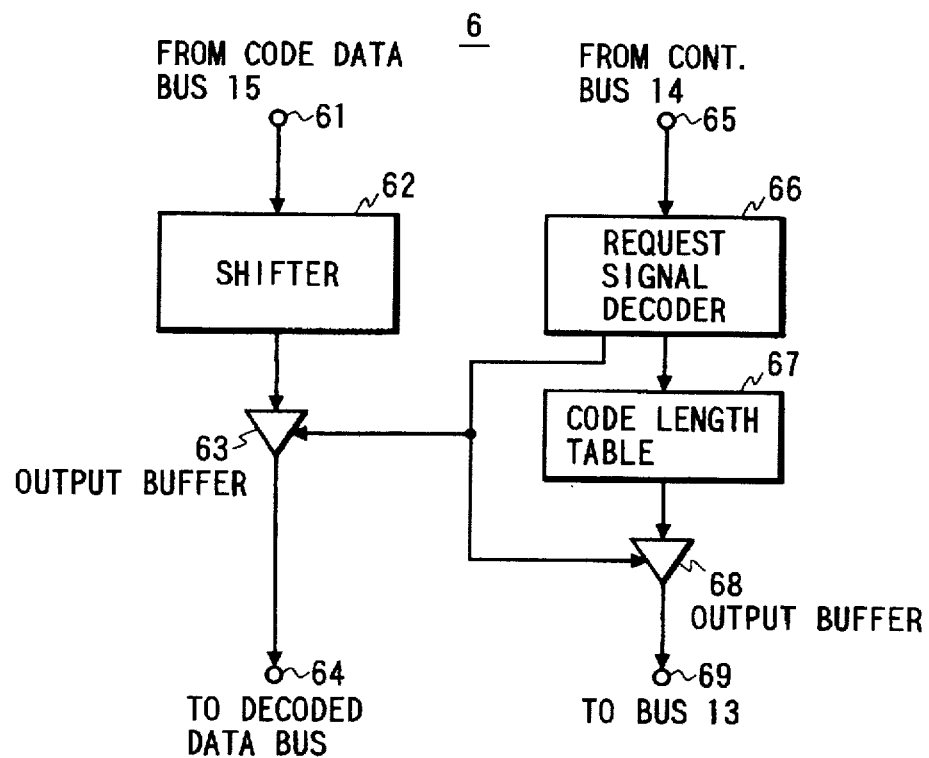
FIG. 5 is a diagram showing the configuration of a decoder 6 of FIG. 1 for decoding fixed-length codes.

FIG. 5 is a diagram showing the configuration of the fixed-length code decoder 6 shown in FIG. 1.

As shown in the figure, the fixed-length code decoder 6 comprises a shift circuit 62 for receiving code data transmitted from the coded data bus 15 through a port 61 directly or indirectly and outputting code data by appropriately shifting or without shifting the code data, and a request decoder 66 for determining whether or not a process to decode a fixed-length code has been requested by decoding a signal transmitted from the control circuit 8 through the control bus 14. The request decoder 66 is also used for controlling, among other components, output buffers 63 and 68 as well as a fixed-length code length table 67. The shift circuit 62 receives code data from the code data bus 15 and the shift circuit 2 shown in FIG. 1 directly or indirectly through a buffering means. The received code data is either shifted by the shift circuit 62 by a predetermined bit-count or not shifted before being output to the decoded data bus 11 from a port 64 via the output buffer 63. When the request decoder 66 determines that a process to decode a fixed-length code has been requested by decoding a control signal transmitted from the control circuit 8 through the control bus 14, the request decoder 66 exercises control to put the output buffer 63 in an activated state so as to output decoded data. In addition, when a process to decode a fixed-length code has been requested, the request decoder 66 selects the code length table 67, requesting the code length table 67 to output code length data to the code length data bus 13 through the output buffer 68.

Since the code length of a fixed-length code is fixed at a bit-count in advance, it is possible to output a code length with such a configuration. In the case of this example, a decoder can be built to give a relatively simple configuration by employing the shift circuit 62 and the code length table 67. It should be noted that, in place of this circuit, another decoder can also be employed for decoding fixed-length codes.

Figure 6:
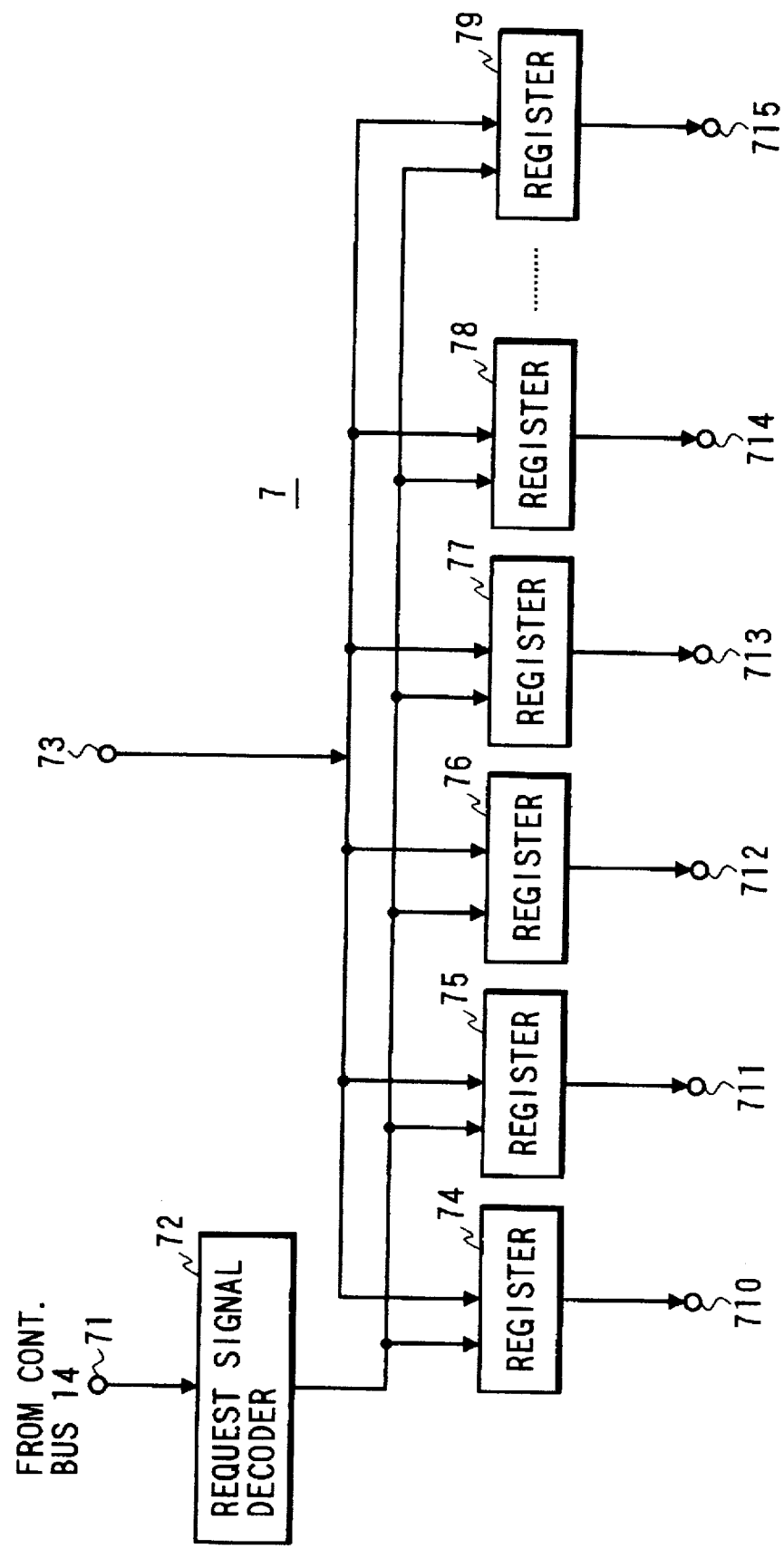
FIG. 6 is a diagram showing the configuration of a parameter/register unit 7 of FIG. 1.

FIG. 6 is a diagram showing the configuration of the register unit 7 shown in FIG. 1.

As shown in the figure, the register unit 7 comprises a request decoder 72 and a plurality of registers 74 to 79. Receiving a signal output by the control circuit 8, the request decoder 72 controls the registers 74 to 79 in such a way that decoded data output to the decoded data bus 11 through a port 73 is stored in one of the registers 74 to 79. As will be described later, the control circuit 8 determines one of the registers 74 to 79 to store the decoded data appearing on the decoded data bus 11 in accordance with, among other factors, decoded data stored in a predetermined register, the decoded data appearing on the decoded data bus 11 and the contents of a counter which indicates the state transition of the control circuit 8. In addition, outputs 710 to 715 of the registers 74 to 79 are connected to the control circuit 8 so that the control circuit 8 can reference data held in the registers 74 to 79 from time to time.

Figure 7:
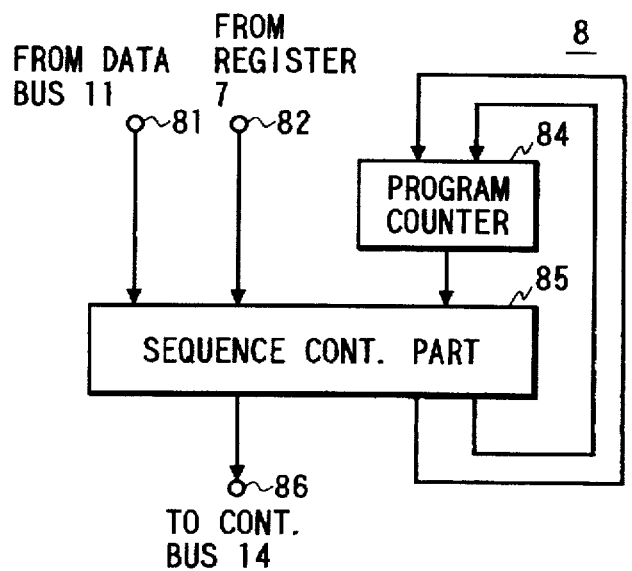
FIG. 7 is a diagram showing the configuration of a decoder control circuit 8 of FIG. 1.

FIG. 7 is a diagram showing the configuration of the control circuit 8 shown in FIG. 1.

As shown in the figure, the control circuit 8 receives data decoded by the variable-length and fixed-length code decoders 5 and 6 and part of data decoded by the DCT coefficient decoder 4 from a port 81 through the decoded data bus 11. In addition, the control circuit 8 also receives data output by the registers 74 to 78 composing the register unit 7 shown in FIG. 6 through a port 82. As shown in FIG. 7, the control circuit 8 comprises a sequence control unit 85 and a program counter 84. The sequence control unit 85 determines the decoding operation to be carried out next. The determination of the next decoding operation is based on decoded data received from the decoded data bus 11 through the port 81, that is, a result of the current as well as on decoding, decoded data stored in the registers 74 to 79 and the current operating state indicated by the program counter 84. Determining the next decoding operation, the sequence control unit 85 outputs a control signal (or a request signal) to the control bus 14 through a port 86. The control signal output by the sequence control unit 85 is decoded by request decoders 4C, 5C and 66 employed in the decoders 4, 5 and 6, respectively, in order to control the decoders 4, 5 and 6. In addition, the control circuit 8 similarly controls the register unit 7, specifying which register decoded data appearing on the decoded data bus 11 should be stored therein.

Since the control circuit 8 can identify the current operating state from the contents of the program counter 84, it is possible for the control circuit 8 to determine whether or not a decoding result appearing on the decoded data bus 11 is to be used in the subsequent processing as a branch condition. Thus, the register unit 7 is controlled in such a way that the decoded data to be used as a branch condition is stored in the corresponding register determined in advance.

Here, the sequence control unit 85 outputs a signal for controlling the program counter 84. To be more specific, pieces of information such as a load signal and a load address are supplied to the program counter 84 to be used in a sequence jump or other applications.

As described above, being connected to the decoded data bus 11, the control circuit 8 can reference the current decoded data and, being connected to the register unit 7, the control circuit 8 can also reference data decoded in the past. If branch processing based on the current decoding result is known from the contents of the program counter 84, the decoded data appearing on the decoded data bus 11 is used for controlling the next operation. If branch processing based on a previous decoding result is known, decoded data stored in a predetermined register can be used as a base for controlling the next operation.

It is obvious from FIG. 1 that, in the case of the present embodiment, the decoders 4 and 5 for variable-length codes are provided separately from the decoder 6 for fixed-length codes, and the decoders 4, 5 and 6 are connected to the output of the shift circuit 2 in parallel. For this reason, even in the case of a supplied bit stream comprising variable-length codes mixed with fixed-length codes, the control circuit 8 can control the appropriate decoders to output decoded data. In this way, both variable-length and fixed-length codes can be decoded correctly. In spite of the fact that the decoders 4 and 5 for variable-length codes are provided separately from the decoder 6 for fixed-length codes, the decoders 4, 5 and 6 share the code data bus 15 for supplying code data and the decoded data bus 11 for outputting decoded data. This allows the number of buses to be reduced and, thus, the size of the circuit can be shrunk. The circuit also becomes smaller in size due to the fact that the decoders 4, 5 and 6 share the shift circuit 2 and the accumulator 3 which supply code data to the decoders 4, 5 and 6. Since code data of video information represented by the MPEG is input as a serial bit stream, the bit stream can be decoded without problems even if the code data and decoded data buses 15 and 11 are shared by the decoders 4, 5 and 6 which are provided in parallel with respect to the buses 15 and 11.

On top of that, even in the case of a decoding process requiring a relatively long time (a decoding process occurring over several clock cycles), the decoders 4, 5 and 6 can be controlled to operate concurrently, allowing the decoding process to be carried out efficiently.

In addition, in the case of the present embodiment, the DCT coefficient decoder 4 for decoding DCT coefficients is provided separately from the variable-length code decoder 5 for decoding variable-length codes other than DCT coefficients. As a result, the process of decoding DCT coefficients, in which a high decoding speed is required, and the process of decoding variable-length codes other than DCT coefficients, in which a relatively long decoding time is allowed, can both be carried out efficiently. The process of decoding DCT coefficients, in which a high decoding speed is required, is implemented typically by employing a special circuit configuration or through the use of a codeword table. As for codes other than DCT coefficients, the decoding process can be carried out by software executed on, among other devices, a general-purpose processor such as a CPU and a DSP. In the case of a decoder comprising codeword tables, codes can be allocated with ease in a process of coding a signal even if different values of decoded data are allocated to the same code because the decoding circuits have code tables independent of each other, resulting no overlapping space.

In addition, in the case of the present embodiment, the coefficient data bus 12 connected to the output of the DCT coefficient decoder 4 is provided independently of the decoded data bus 11 connected to the output of the variable-length code decoder 5. As a result, time restrictions on the occupation of the buses by decoded data are relieved. In particular, decoded data other than DCT coefficients includes a lot of data such as macroblock information used frequently in processing modules (for example, circuit blocks for motion compensation) at later stages. Accordingly, by separating the bus for transmitting DCT coefficients having a large amount of data resulting from a decoding process from the bus for transmitting these parameters, the parameters can be passed through the bus efficiently.

In the case of the present embodiment, the DCT coefficient decoder 4 is provided separately from the variable-length code decoder 5. It should be noted, however, that DCT coefficients are also variable-length codes. Therefore, a variable-length code decoder common to DCT-coefficients and other variable-length codes can be used. In this case, it is necessary to provide an output bus controller for controlling the selection of a bus to receive the output of the common variable-length code decoder. By letting the control circuit 8 control the output bus controller, decoded data of DCT coefficients can be output to a bus provided separately from a bus for outputting other kinds of decoded data. As a result, the same effects can be obtained.

In the case of the present embodiment, DCT coefficients are given as an example of codes requiring a high decoding speed. It should be noted, however, that the scope of the present invention is not limited to such codes. The present invention can also be applied to the so-called block-level transformation and decoding processes as well. A block is the smallest unit used in video-signal processing and comprises a plurality of pixels, typically, 8×8 pixels. It is necessary to decode a block, which comprises a plurality of pixels and is used as a smallest unit in a transformation and decoding process of video signals, at a real-time speed all but keeping up with real-time pictures. The application of present invention to the decoding of such codes is an effective application.

Figure 12:
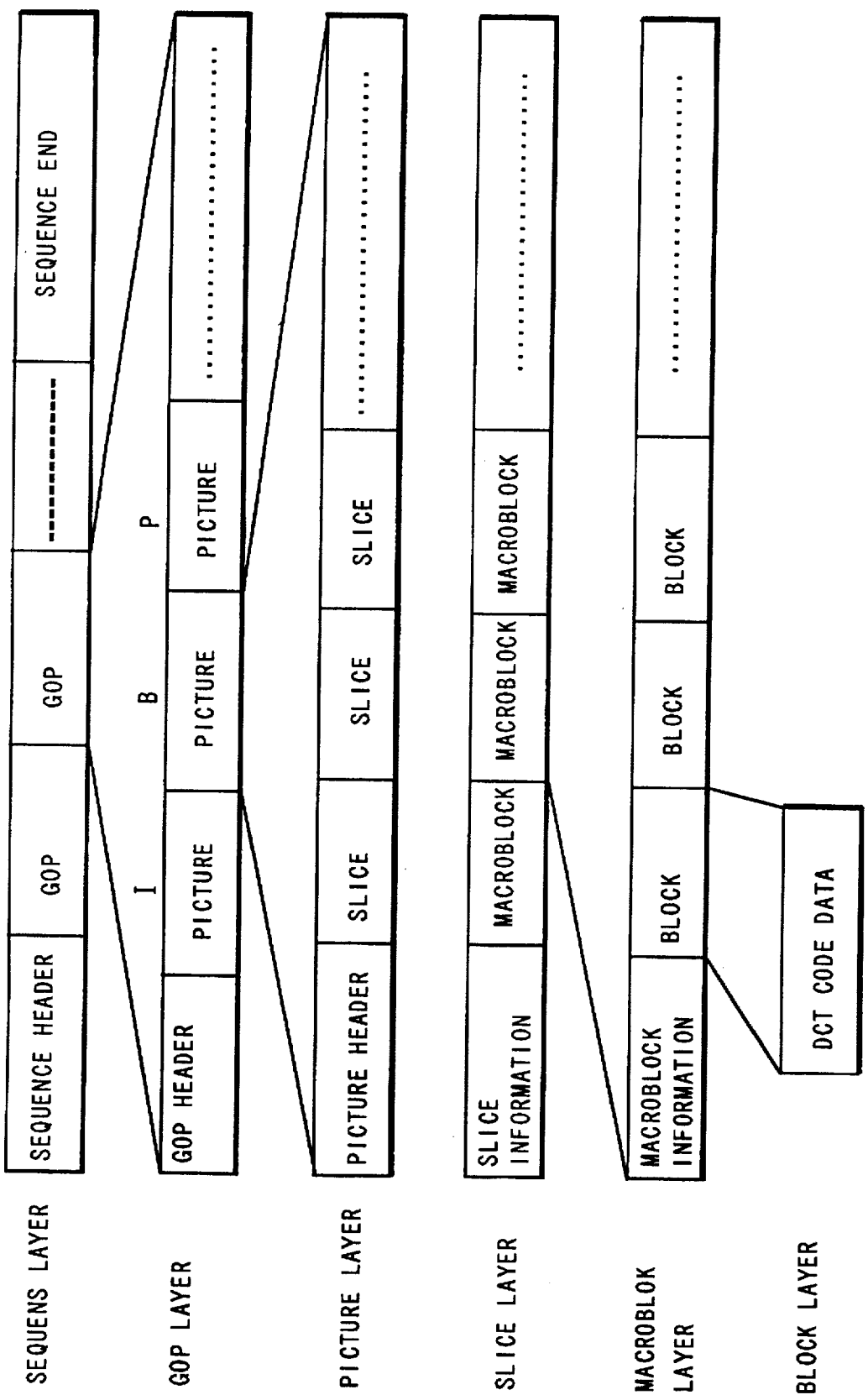
FIG. 12 is a diagram showing the configuration of an MPEG bit stream.

In addition, in the case of the present embodiment, codes other than DCT coefficients are cited as an example of codes which allow decoding to be completed in a relatively long time. It should be noted, however, that the present invention can also be applied to the decoding of codes other than the smallest unit described above. As shown in FIG. 12, the bit stream of a video signal represented by the MPEG or the like comprises a plurality of layers: a sequence layer, a GOP layer, a picture layer, a slice layer, a macroblock layer and a block layer. Details of the parameters, syntax and other information are prescribed in ISO/IEC 13818-2. It is sufficient merely to decode fixed-length codes of the sequence header of the sequence layer in which the picture size and display position are included before the process of decoding 1 screen or 1 frame is completed. Relatively, there is a time margin in the processing. The GOP header, the picture header and the slice information are decoded by the fixed-length code decoder 6. The macroblock, which is a type of picture data, is decoded by the variable-length code decoder 5. A block in the macroblock, that is, DCT code data is decoded by the DCT coefficient decoder 4 at a real-time speed which all but keeps up with real-time pictures.

In addition, in the case of the present embodiment, pieces of data decoded by the variable-length code decoder 5 and the fixed-length code decoder 6 as well as the EOB (End of Block) indicating the end of DCT coefficients of each block output by the DCT coefficient decoder 4 are stored in the register unit 7 through the decoded data bus 11 in a predetermined order. The decoded data stored in the register unit 7, decoded data appearing on the decoded data bus 11 and the contents of a counter indicating the state transition of control circuit 8 are used for determining a next operation to be carried out, allowing the decoders and other components to be controlled through the control bus.

By adopting such a configuration, the current decoded data can be used to carry out a decoding process requiring branch processing or a decoding process with a different decoding operation to be performed next. Likewise, decoded data preceding the current one by a predetermined decoded-data-count can be used to execute a decoding process with a different decoding operation to be performed next.

Figure 8:
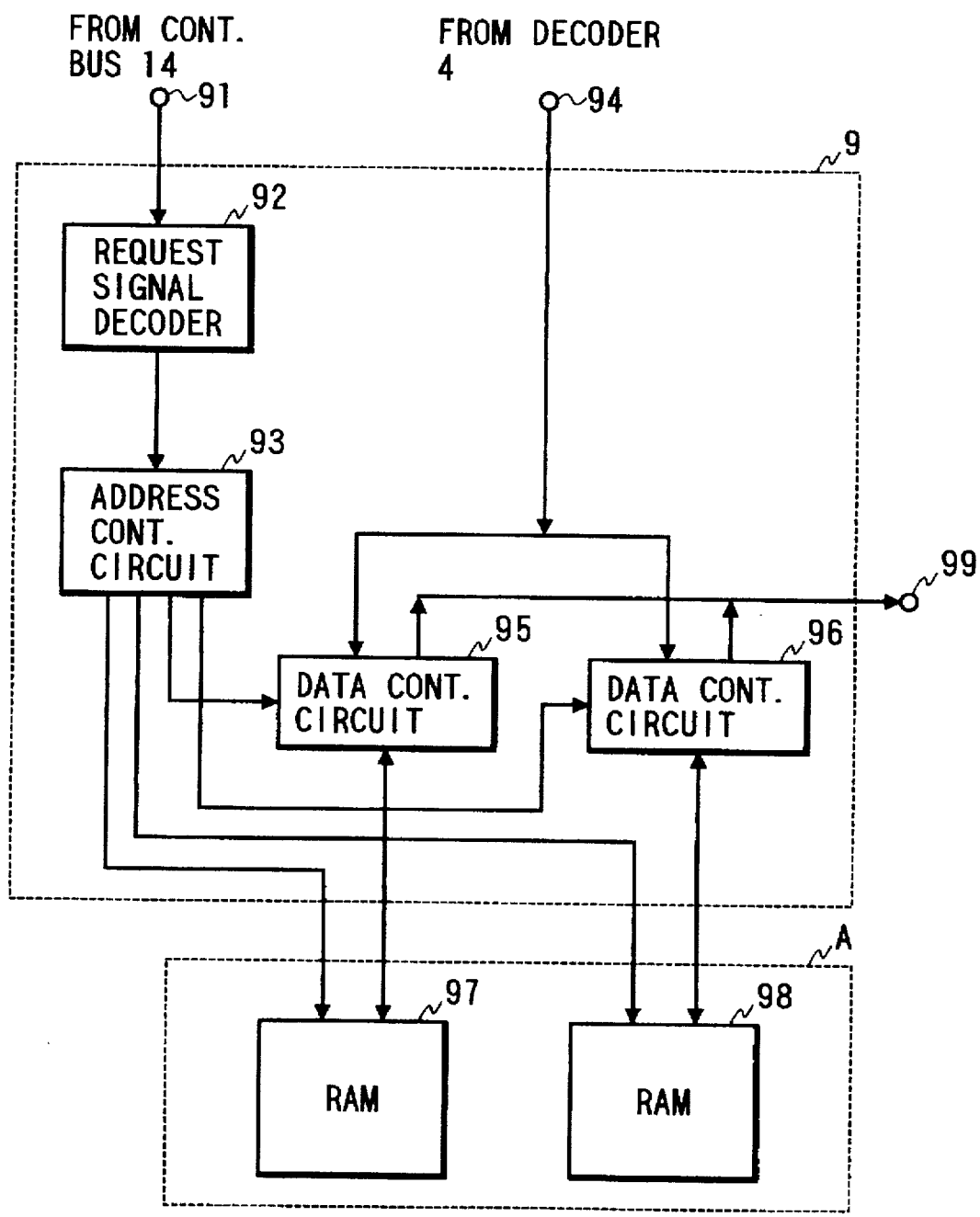
FIG. 8 is a diagram showing the configuration of a DCT-coefficient RAM controller 9 of FIG. 1.
Figure 9:
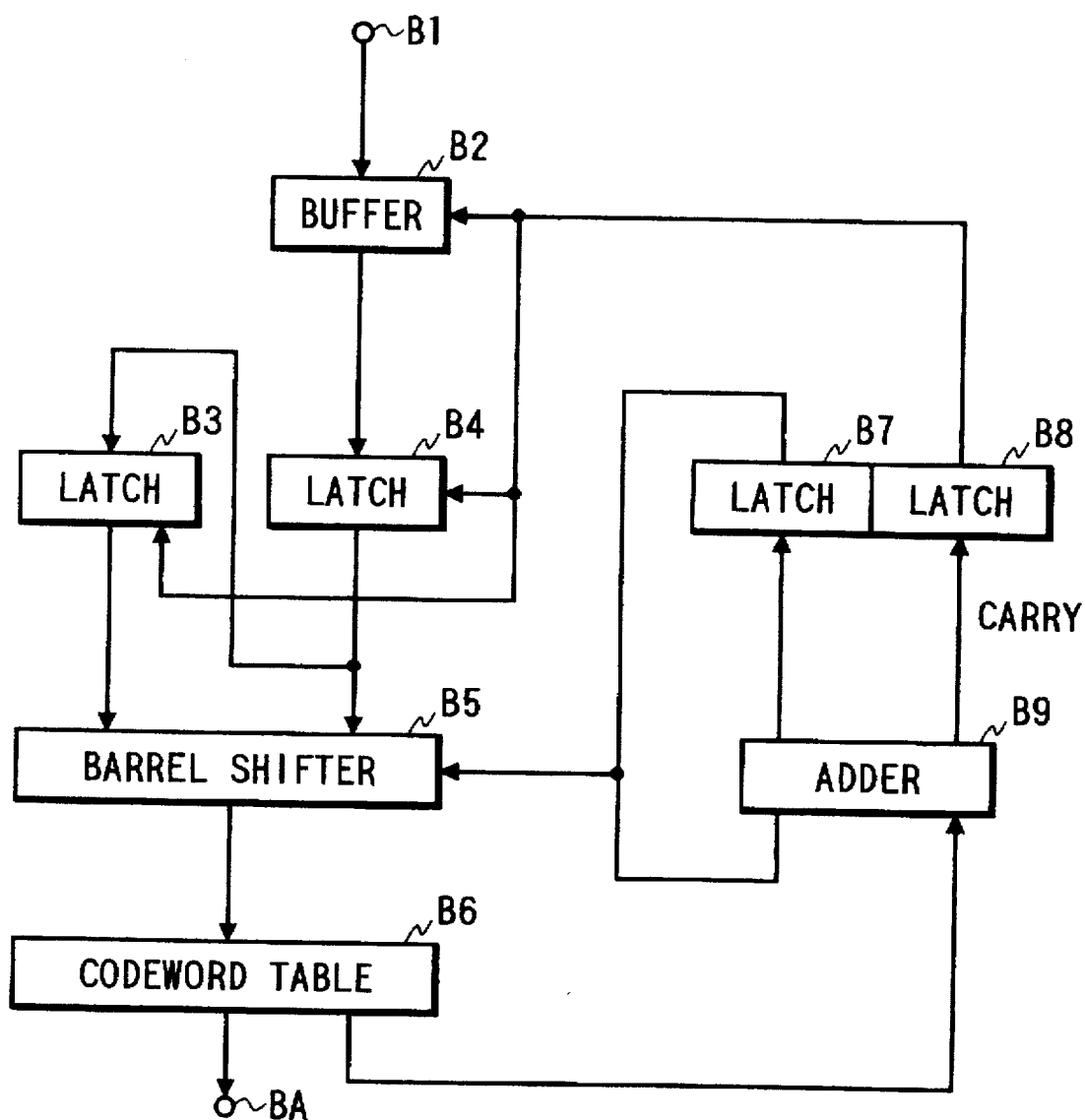
FIG. 9 is a diagram showing a general configuration of a variable-length code decoding circuit according to a prior art structure.

The configuration of the memory control circuit 9 and a memory unit A shown in FIG. 1 is shown in FIG. 8. As shown in the figure, the memory control circuit 9 comprises a request decoder 92, a control circuit 93 for controlling the memory unit A by carrying out, among other operations, the generation of addresses and other signals for the memory unit A and data control circuits 95 and 96 for controlling data written into and read from the memory unit A. In a typical configuration, the memory unit A comprises two sub-units 97 and 98 for a reason to be described later. The memory sub-units 97 and 98 are each RAMs (Random Access Memory) configured in such a way that operations to input and output addresses and data to and from one of the memory sub-units can be controlled independently of those for the other memory sub-unit.

The request decoder 92 receives a control signal from the control bus 14 through a port 91, controlling the control circuit 93 for generating addresses. Receiving a signal from the request decoder 92, the control circuit 93 creates a predetermined address and supplies an address signal to the RAM 97 or 98. In addition, a signal from the request decoder 92 is similarly used for controlling the data control circuit 95 or 96 which is, in turn, used for controlling an operation to write or read out data into or from the RAM 97 or 98. Decoded data of DCT coefficients is supplied by the DCT coefficient decoder 4 to the data control circuits 95 and 96 via a port 94 directly or indirectly through a buffering means.

Consider an operation to write decoded data into the RAM 97 as an example. In this case, the address control circuit 93 provides the RAM 97 with an address at which the data is to be written. At the same time, the data control circuits 95 and 96 are controlled in such a way that the data output by the DCT coefficient decoder 4 is supplied to the RAM 97. As for the RAM 98 to which no data is to be written in this operation, the data control circuit 96 is typically controlled in such a way that the decoded data is not written into the RAM 98. This control is also applicable to a read operation as well. To be more specific, data is read from an address in the RAM 97 or 98, which address is specified by the control circuit 93, and then supplied through the data control circuit 95 or 96 to a port 99 connected to the DCT coefficient bus.

Here, decoded data produced by the DCT coefficient decoder 4 can be output to the coefficient data bus directly without being stored in the memory unit A. With a configuration like the one adopted in this embodiment, however, incoming decoding results of a DCT coefficient code can be rearranged before being output to the DCT coefficient bus. The decoded results need to be rearranged because scan transformation, such as transformation to a zigzag or alternate scan, has been carried out at a block level during the coding process. It is necessary to complete the scan transformation prior to an inverse discrete cosine transformation processing to be described later. If carried out at a location relatively close to the output of the DCT coefficient decoder 4, as is the case with the present embodiment, however, synchronization with the clock signal can be established during an operation to output the data from the memory unit A, allowing output timing to be adjusted. As a result, timing to transfer data to the next block can also be adjusted, resulting in a margin in the transfer time even if data needs to be transferred through a relatively long signal line between blocks carrying out inverse discrete cosine transformation processing. As an alternative, in a block performing inverse discrete cosine transformation processing, scan transformation can also be carried out. In this case, however, a signal line connecting the decoder 4 and the next block becomes relatively long, making it necessary to separately provide a means for adjusting timing of output data at a location on the signal line.

In addition, the memory unit A can be replaced by a memory having a single input/output port. By adopting a configuration with two memory sub-units, as is the case with the present embodiment, however, data can be read out from one of the RAM sub-units while data is being written into another RAM sub-unit, allowing pipe-line processing to be carried out. As a result, the processing wait time at each block can be eliminated. On top of that, the configuration can be extended to three or more memory sub-units if necessary. In the case of a configuration comprising only two memory sub-units, when the inverse discrete cosine transformation processing at the next block takes time, it is quite within the bounds of possibility that a contention between an operation to write DCT coefficients completing the processing and an operation to read out DCT coefficients for inverse discrete cosine transformation processing exists. By adopting the configuration comprising three memory sub-units described above, however, the DCT coefficients can be sequentially read out and written, allowing this problem to be solved.

As another alternative, the generation of an address by the memory control circuit can be implemented by an address counter circuit which is controlled by the control circuit 8. With the memory configured into two sub-units, two address counter circuits are prepared, allowing data to be read out and written from and into the two memory sub-units with free timing. Even in the case of a configuration comprising two memory sub-units, a ROM unit or the like can be provided for converting the contents of an address counter into an address. In such a scheme, the output of the address counter circuit can be supplied directly to one of the memory sub-units whereas an address resulting from the conversion carried out by the ROM unit can be supplied to the other memory sub-unit, allowing scan transformation to be carried out by a simple configuration. In this case, since both the memory sub-units operate to read out and/or write data at addresses supplied by the same address counter circuit, a configuration can be devised so that an operation to write data into one of the memory sub-units can be carried out synchronously with an operation to read out data from the other memory sub-unit with the same timing.

In addition, a so-called dual port memory not shown in the figure can also be configured as well wherein two input/output circuits of the memory are provided separately from each other. In this case, the output of the DCT coefficient decoder is connected to the input port of the dual port memory whereas the output port of the dual port memory is connected to inverse quantization and inverse discrete cosine transformation circuits at the next stage through the coefficient data bus. In such a configuration, the data control circuits shown in the figure are not required any more, and, in addition, the input and output ports of the dual port memory can be provided, being separated from each other by a distance. As a result, the freedom to lay out the buses connected to the ports is enhanced.

FIG. 10 is a diagram showing a typical configuration of variable-length decoded data adopted in the present embodiment.

As shown in the figure, a variable-length code is a bit stream comprising a plurality of bits such as 000110S and 00011S, with the number of bits varying from code to code, where the capital character S denotes a positive or negative sign bit. Each code has a prefix determined in advance. A prefix comprises several bits at the head of the code. In the case of the 000110S code, the first four bits 0001 are the prefix. The prefix decoders 41 and 52 shown in FIGS. 3 and 4, respectively, decode this prefix, selecting a codeword table associated with the prefix. The codeword table selected in accordance with the decoded prefix is provided with code bits other than the prefix, which code bits determine the output. Consider the code 000110S as an example. In this case, the code bits 10S, bits remaining in the code with the prefix 0001 removed, are supplied to the codeword table, and decoded data of Run 1 and Level 2 is obtained as an output.

FIG. 11 is a diagram showing the configuration of a video playback apparatus employing the decoding device provided by the present invention. In the case of the present embodiment, codes conveying video information resulting from an MPEG encoding process are decoded.

In a process to compress and encode a video signal by means of an MPEG technique, a variety of encoding means such as variable-length coding, discrete cosine transformation and motion compensation are adopted. As a result, it is necessary to provide a decoder for decoding the compressed and encoded signal which decoder is equipped with decoding units (decoding modules) serving as counterparts of the various encoding means.

In the configuration shown in FIG. 11, a compressed and encoded video signal is received and then decoded before finally being output to a display device such as a CRT as a video output. As a design alternative, a decoder X can also be built on a semiconductor substrate a decoder LSI (Large Scale Integrated Circuit) as. By carrying out a series of decoding processes, from time of receiving of a bit stream to time of outputting of a video output, in a single LSI, buses connecting decoding unit blocks X4, X5, X6 and X7 can be built on the semiconductor substrate, allowing the decoding processings to be implemented at a high speed. In particular, it is necessary to transmit a decoding signal conveying a large amount of data at a high speed through the coefficient data bus as will be described later.

The operation of the decoder X shown in FIG. 11 is explained as follows. A bit stream of a video signal or the like is supplied to a host interface (I/F) X1 from a source outside the LSI. The bit stream is stored temporarily in a front-end memory unit Y through a FIFO unit X2 by a DRAM controller (DRAMC) X3. The bit stream typically has a hierarchical configuration comprising smallest units which are each created as follows. The video signal undergoes a motion compensating process in block units by, typically, taking the difference from the picture of a preceding frame. The result of the motion compensation is subjected to a discrete cosine transformation (DCT) process and its DCT coefficients are encoded into a variable-length code. The output of the variable-length encoding is used as the smallest unit cited above.

The bit stream is properly read out from the memory unit Y and then supplied to the decoding unit X4 through the DRAM controller X3. The decoding unit X4 is preferably the decoding device shown in FIG. 1. The decoding unit X4 decodes the bit stream supplied thereto, outputting decoded data. A decoded result of the decoded data related to DCT coefficients is directly output to the conversion unit (IQ/IDCT) X5 for performing inverse quantization and inverse discrete cosine transformation processes through the coefficient data bus XE serving as an independent data bus as shown in FIG. 1. As also shown in FIG. 1 and other figures, data resulting from the variable-length decoding process other than the DCT coefficients is supplied to the conversion unit X5, a motion compensating circuit X6 and the display controller X7 through the decoded data bus XD. Typically, the conversion unit X5 comprises a buffer connected to the coefficient data bus XE for receiving DCT coefficient data and a buffer connected to the decoded data bus XD for receiving decoded data.

Furthermore, control signals for controlling the modules X5, X6 and X7 of the decoders and the like are supplied from the control circuit 8 shown in FIG. 1 through the control bus XC, controlling the decoding operations carried out in the modules X5, X6 and X7. The modules X5, X6 and X7 take in required decoded data such as parameters indicated by decoding results out of decoded data information from the decoded data bus XD and information from the control bus in carrying out their operations.

DCT coefficients supplied to the conversion unit X5 undergo inverse quantization and inverse discrete cosine transformation processes therein before being supplied to the motion compensating circuit X6. The motion compensating circuit X6 takes in a reference picture output by the memory unit Y through the DRAM controller X3, adding it to the output of the conversion unit X5. The result of the addition is then stored in the memory unit Y as a decoded picture. The decoded picture created in this way is read out properly by the display controller X7 through the DRAM controller X3 and output to the external world outside the LSI. This video output is displayed as a picture on a display device such as a CRT which is not shown in the figure.

A RAM unit X8 is connected to the decoding unit X4 through the decoded data bus XD, allowing decoded data output by the decoding unit X4 to be stored in the RAM unit X8. Data stored in the RAM unit X8 includes, for example, user data which can be embedded in the bit stream by the transmitter. The data can be read out from the outside of the LSI through a host interface. A timing circuit X9 is a circuit for generating a reference signal used for compensating the operation timings of the modules. Even though not shown in the figure, the reference signal is supplied to each of the modules. A clock circuit XA is a circuit for generating a clock signal for the decoder LSI X.

It is obvious from the present embodiment that, since the coefficient data bus XE for outputting DCT coefficients is directly connected to the conversion unit X5 as an independent bus, decoded data can be referenced by means of the decoded data bus XD even while DCT coefficients are being output. For example, after a code in a supplied bit stream showing the size of the picture and the like has been decoded by the decoding unit X4, the code can be referenced by the display controller X7 or the like without regard to the output of DCT coefficients appearing on the coefficient data bus XE. In addition, even if results of a decoding process carried out by the decoding unit X4 is stored in a register circuit in the decoding unit X4, codes can be similarly referenced from other modules from time to time through the decoded data bus XD. In a case in which decoded results need to be referenced from the outside of the LSI X1, a system including the LSI X1 can be configured by not considering limitations as to whether or not the output DCT coefficients occupy the bus.

In addition, according to the present embodiment, the modules are controlled by using the control circuit 8 of FIG. 1 employed in the decoding unit X4 through control signals transmitted via a common data bus XC. As a result, it is not necessary to provide each of the modules with a control circuit, and it is, thus, possible to reduce the size of the circuit.

It is also possible to implement a decoder which allows the processing of the next code to be changed in accordance with a decoded code by adopting a simple and reasonable circuit configuration wherein codes to be decoded comprise variable-length codes mixed with fixed-length codes.

In addition, by implementing the decoding process requiring a high speed by means of an independent circuit, the processing power of the decoder can be enhanced.

What is claimed is:

1. A decoding device for decoding an input bit stream including variable-length and fixed-length codes, said decoding device comprising:

a shift circuit for inputting and shifting a bit signal of said input bit stream including variable-length and fixed-length codes before outputting said bit signal;

a variable-length code decoder and a fixed-length code decoder connected to the output of said shift circuit in parallel, wherein said variable-length code decoder operates for decoding said variable-length code shifted and then output by said shift circuit and for outputting decoded data and a code length of said variable-length code whereas said fixed-length code decoder operates for decoding said fixed-length code shifted and then output by said shift circuit and for outputting decoded data and a code length of said fixed-length code; and a shift controller for controlling a shift amount of said shift circuit in accordance with data representing said code lengths output by said variable-length code decoder and said fixed-length code decoder;

a first data bus shared by said variable length code decoder and fixed-length code decoder;

a register unit having a plurality of register circuits for storing said decoded data output by said variable-length code decoder and said fixed-length code decoder; and a control circuit receiving decoded data stored in said register unit and decoded data from said first data bus, wherein said control circuit operates for determining which of said variable-length code decoder and said fixed-length code decoder will carry out a next decoding operation and for controlling decoding operations of said variable-length code decoder and said fixed-length decoder in accordance with decoded data stored in said register unit and decoded data from said first data bus, wherein said first data bus receives said decoded data output by said variable-length code decoder and said fixed-length code decoder and transmits the received decoded data to said register unit and to said control circuit.

2. A decoding device according to claim 1, wherein said control circuit comprises:

a program counter showing a present condition of a decoding operation of said variable-length code decoder and said fixed-length code decoder, and a circuit for producing a request signal showing a decoder to be operated next in response to the output of the program counter, the register unit and the data bus.

3. A decoding device for decoding an input bit stream including variable-length codes, said decoding device comprising:

a shift circuit for inputting and shifting a digital signal of said input bit stream before outputting said digital signal;

a first variable-length code decoder and a second variable-length code decoder connected to the output of said shift circuit in parallel, wherein said first variable-length code decoder operates for decoding predetermined variable-length codes of said digital signal at a mandatory high speed required by said predetermined variable-length codes and for outputting decoded data and a code length of said predetermined variable-length codes whereas said second variable-length code decoder operates for decoding remaining variable-length codes of said digital signal other than said predetermined variable-length codes and for outputting decoded data and a code length of said remaining variable-length codes; and an accumulator for finding a shift amount of said shift circuit from data representing said code lengths output by said first variable-length code decoder and said second variable-length code decoder and for controlling said shift circuit.

4. A decoding device according to claim 3, wherein said predetermined variable-length codes requiring decoding at said mandatory high speed are codes encoded in units each comprising a plurality of pixels of a picture signal.

5. A decoding device according to claim 3, wherein said predetermined variable-length codes requiring decoding at said mandatory high speed are discrete cosine transformation coefficients encoded into variable-length codes in units each comprising a plurality of pixels.

6. A decoding device according to claim 3, further comprising:

a register unit having a plurality of register circuits for storing said decoded data output by said first variable-length code decoder and said second variable-length code decoder;

a control circuit receiving decoded data output by said second variable-length code decoder and said decoded data stored in said register unit, said control circuit used for controlling next decoding operations of said first variable-length code decoder and said second variable-length code decoder in accordance with said decoded data received from said second variable-length code decoder and said register unit; and a random access memory for storing decoded data output by said first variable-length code decoder under control performed by said control circuit.

7. A signal decoding device according to claim 6, wherein said predetermined variable-length codes requiring decoding at said mandatory high speed are discrete cosine transformation coefficients encoded into variable-length codes in units each comprising a plurality of pixels.

8. A decoding device for decoding an input bit stream including first and second types of variable-length codes and fixed-length codes, said decoding device comprising:

a shift circuit for inputting and shifting a digital signal of said input bit stream before outputting a bit signal;

a first variable-length code decoder, a second variable-length code decoder and a fixed-length code decoder which are connected to the output of said shift circuit in parallel, said first variable-length code decoder decoding the first type of variable-length codes and outputting decoded data and a code length of the first type of variable-length code, said second variable-length code decoder decoding the second type of variable-length codes and outputting a code length of the second type of variable-length code, and said fixed-length code decoder decoding said fixed-length codes and outputting decoded data and a code length of said fixed-length code;

a shift controller for controlling a shift amount of said shift circuit in accordance with data representing said code lengths outputted by said first and second variable-length code decoders and said fixed-length code decoder;

a first data bus transmitting output decoded data of said second variable-length code decoder, output decoded data of said fixed-length code decoder and a part of output signal of said first variable-length code decoder;

a register unit having a plurality of registers for storing said decoded data of said second variable-length code decoder and said fixed-length code decoder through said first data bus; and a control circuit for receiving decoded data stored in said register unit and decoded data from said first data bus, and for determining one decoder of said two variable-length code decoders and said fixed-length code decoder to carry out a next decoding operation in accordance with decoded data stored in said register unit and decoded data from said first data bus.

9. A decoding device according to claim 8, wherein said control circuit comprises:

a program counter showing a present condition of decoding operation of said first and second variable-length code decoders and said fixed-length code decoder, and a circuit for producing a request signal showing a decoder to be operated next in response to the output of the program counter, the register unit and the data bus.

10. A decoding device according to claim 9, wherein said input bit stream is a video signal including variable-length codes representing a DCT coefficient and other variable-length codes, wherein said first and second variable-length code decoder decode the variable length code representing the DCT coefficient and the other variable length codes, respectively, and wherein said one part of the output signal of said first variable-length code decoder is an end of block (EOB) signal of the DCT coefficient.

11. A decoding device according to claim 9, wherein said input bit stream is a video signal of MPEG including variable length code representing a DCT coefficient and other variable length codes, wherein said first and second variable-length code decoders decode the variable length code representing the DCT coefficient and the other variable length codes, respectively, and wherein said first variable-length code decoder outputs decoded data of the DCT coefficient and EOB signal and sends the decoded data of the DCT coefficient to a memory through a second bus, and sends the EOB signal to said register unit and the control circuit through the first bus.

* * * * *